United States Patent
Kolbasow et al.

(10) Patent No.: US 11,183,481 B2
(45) Date of Patent: Nov. 23, 2021

(54) METHOD AND DEVICE FOR ESTABLISHING A WIRE CONNECTION AS WELL AS A COMPONENT ARRANGEMENT HAVING A WIRE CONNECTION

(71) Applicant: PAC TECH—PACKAGING TECHNOLOGIES GMBH, Nauen (DE)

(72) Inventors: Andrej Kolbasow, Karstädt OT Nebelin (DE); Jan Hoffmann, Michendorf (DE); Matthias Fettke, Berlin (DE)

(73) Assignee: PAC TECH—PACKAGING TECHNOLOGIES GMBH, Nauen (DE)

( * ) Notice: Subject to any disclaimer, the term of this patent is extended or adjusted under 35 U.S.C. 154(b) by 29 days.

(21) Appl. No.: 16/623,723

(22) PCT Filed: Mar. 15, 2018

(86) PCT No.: PCT/EP2018/056497
§ 371 (c)(1),
(2) Date: Dec. 17, 2019

(87) PCT Pub. No.: WO2019/001783
PCT Pub. Date: Jan. 3, 2019

(65) Prior Publication Data
US 2020/0161273 A1 May 21, 2020

(30) Foreign Application Priority Data

Jun. 29, 2017 (DE) .................... 10 2017 114 530.3
Jul. 3, 2017 (DE) ....................... 102017 114 771.3

(51) Int. Cl.
*H01L 23/00* (2006.01)
*B23K 1/005* (2006.01)
(Continued)

(52) U.S. Cl.
CPC ............ *H01L 24/85* (2013.01); *B23K 1/0056* (2013.01); *B23K 3/0623* (2013.01); *H01L 24/48* (2013.01);
(Continued)

(58) Field of Classification Search
None
See application file for complete search history.

(56) References Cited

U.S. PATENT DOCUMENTS 4,351,468 A 9/1982 Floury et al.
4,484,054 A 11/1984 Morino
(Continued)

FOREIGN PATENT DOCUMENTS

CN 1098819 A 2/1995
CN 1518082 A 8/2004
(Continued)

OTHER PUBLICATIONS

China National Intellectual Property Administration, First Office Action and Search Report, Application No. 201880040702.9, dated Nov. 4, 2020, 20 pages.
(Continued)

*Primary Examiner* — Dung A. Le
(74) *Attorney, Agent, or Firm* — Quarles & Brady LLP

(57) ABSTRACT

A method and a device for establishing a wire connection between a first contact surface and at least one further contact surface. A contact end of a wire is positioned in a contact position relative to the first contact surface with a wire guiding tool. Subsequently, a mechanical, electrically conductive connection is established between the first contact surface and the contact end with a first solder material connection, and subsequently the wire guiding tool is moved to the further contact surface thus forming a wire section and establishing a further mechanical, electrically conductive
(Continued)

connection between the wire section end and the further contact surface with a further solder material connection.

11 Claims, 3 Drawing Sheets

(51) Int. Cl.
  *B23K 3/06* (2006.01)
  *B23K 101/38* (2006.01)
(52) U.S. Cl.
  CPC .......... *H01L 24/78* (2013.01); *B23K 2101/38* (2018.08); *H01L 2224/48465* (2013.01); *H01L 2224/7855* (2013.01); *H01L 2224/78263* (2013.01); *H01L 2224/78611* (2013.01); *H01L 2224/85214* (2013.01); *H01L 2224/85815* (2013.01)

(56) References Cited

U.S. PATENT DOCUMENTS

| | | | |
|---|---|---|---|
| 4,780,594 A | 10/1988 | Rothermel | |
| 5,485,949 A | 1/1996 | Tomura et al. | |
| 7,859,123 B2 * | 12/2010 | Tzu | H01L 24/85 257/781 |
| 8,372,741 B1 | 2/2013 | Co et al. | |
| 8,657,181 B2 | 2/2014 | Cheng et al. | |
| 2002/0047213 A1 | 4/2002 | Komiyama et al. | |
| 2004/0060971 A1 | 4/2004 | Azdasht | |
| 2004/0188499 A1 | 9/2004 | Nosaka | |
| 2008/0023831 A1 | 1/2008 | Nishimura et al. | |
| 2008/0088012 A1 * | 4/2008 | Ohkawa | H01L 21/4842 257/735 |
| 2010/0126763 A1 * | 5/2010 | Matsumura | B23K 20/007 174/261 |
| 2011/0057299 A1 | 3/2011 | Takata et al. | |
| 2015/0017765 A1 * | 1/2015 | Co | H01L 23/3121 438/126 |
| 2018/0147646 A1 * | 5/2018 | Collins | H01R 43/0221 |
| 2018/0211943 A1 | 7/2018 | Song et al. | |

FOREIGN PATENT DOCUMENTS

| | | |
|---|---|---|
| CN | 1846919 A | 10/2006 |
| CN | 101114628 A | 1/2008 |
| CN | 201402807 Y | 2/2010 |
| CN | 102024724 A | 4/2011 |
| CN | 207914735 U | 9/2018 |
| DE | 3051232 C2 | 2/1995 |
| EP | 0622149 A1 | 11/1994 |
| EP | 2837458 A1 | 2/2015 |
| FR | 2605176 A1 | 4/1988 |
| GB | 2120152 A | 11/1983 |
| JP | H07183656 A | 7/1995 |
| JP | 2000094129 A | 4/2000 |
| JP | 2015508240 A | 3/2015 |
| WO | 03024653 A1 | 3/2003 |
| WO | 2017023060 A1 | 2/2017 |

OTHER PUBLICATIONS

PCT International Search Report, PCT/EP2018/056497, dated Jun. 15, 2018, 6 pages.
PCT English Language Translation of the International Preliminary Report on Patentability, PCT/EP2018/056497, dated Jan. 9, 2020, 10 pages.
Japan Patent Office, Notice of Grounds of Rejection, Application No. 2019-570047, dated May 25, 2021, 15 pages.
China National Intellectual Property Administration, Second Office Action and Search Report, Application No. 201880040702.9, dated Apr. 12, 2021, 16 pages.

* cited by examiner

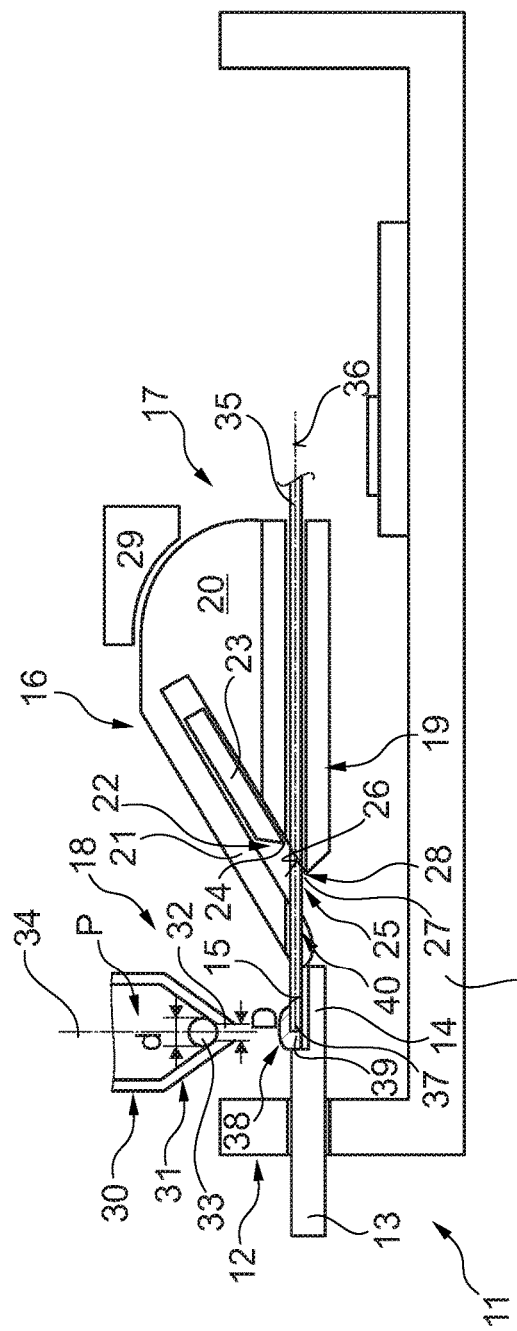
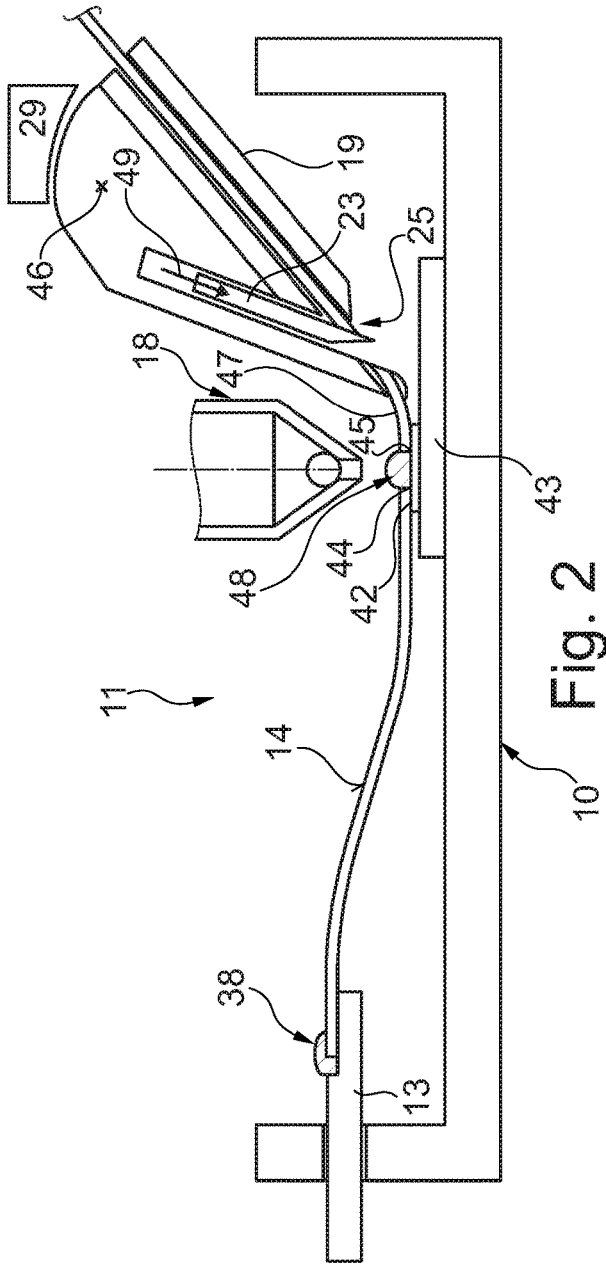

METHOD AND DEVICE FOR ESTABLISHING A WIRE CONNECTION AS WELL AS A COMPONENT ARRANGEMENT HAVING A WIRE CONNECTION

CROSS-REFERENCE TO RELATED APPLICATIONS

This application represents the national stage entry of PCT International Patent Application No. PCT/EP2018/ 0566497 filed on Mar. 15, 2018 and claims priority to German Patent Application No. DE 10 2017 114 530.3 filed Jun. 29, 2017, and German Patent Application No. DE 10 2017 114 771.3 filed Jul. 3, 2017. The contents of these applications are hereby incorporated by reference as if set forth in their entirety herein.

The disclosure relates to a method for establishing a wire connection between a first contact surface and at least one further contact surface according to claim 1. Furthermore, the disclosure relates to a device usable with said method as well as a component arrangement produced by means of said method.

Devices for producing wire connections have long been known, in particular under the name "wire bonder". Typically these devices are realized such that both the positioning of a contact end of a wire guided in a wire guiding capillary relative to the contact surfaces to be connected to each other and the connection between the wire and the contact surfaces are performed by means of the wire guiding tool, as is known from U.S. Pat. No. 8,657,181 B2 for example.

In order to establish the connection, ultrasound is applied to a part of the wire guiding tool, which is realized like a stamp and is commonly referred to as a "wedge", so that the wire arranged between the "wedge" and the contact surface is connected to the contact surface in a friction welding process via the application of ultrasound.

The implementation of this welding process presumes a sufficient pressurization of the wire besides the application of ultrasound to the "wedge", which performs oscillating vibrations parallel to the contact surface due to the application of ultrasound, so that the wire must be pressed against the contact surface using a corresponding compressive force. From this type of application, a corresponding mechanical stress on the contact surface and on the component provided with this contact surface results.

From the above it becomes clear that establishing a wire connection by means of ultrasonic bonding presumes a corresponding mechanical durability and an accessibility of the contact location. Therefore, ultrasonic bonding is generally used where it is a matter of producing a wire having an easily accessible contact surface on a mechanically durable circuit board, also known as a printed circuit board in technical terminology.

The object of the disclosure at hand is to enable establishing wire connections between contacts even in such instances in which the contact location is not easily accessible or an electric contact is to be established between a wire and a contact or a contact body, which is not to be mechanically stressed. Furthermore, the object of the invention is to enable component arrangements while using wire connections established in such a manner.

In order to attain this object, the method according to the disclosure comprises the features of claim 1.

According to the disclosure and differing from the known wire guiding tool realized as a wire bonder which can serve for positioning the wire to be contacted to a surface as well as for establishing the mechanical contact between the wire and the contact surface by applying ultrasound to the wire, a wire guiding tool is used which serves merely for positioning the wire relative to the contact but not for establishing the contact connection between the wire and the contact. Rather, the electrically conductive as well as mechanically durable connection is established by means of wetting a contact area, which is formed between the first contact surface and the contact end, using an at least partially fused first solder material amount formed from a solder material molded piece for establishing a first solder material connection in such a manner that a mechanical electrically conductive connection is established between the first contact surface and the contact end.

Subsequently, the wire guiding tool is moved towards the further contact surface such that a contact area is formed between a wire section end of a wire section, said wire section being formed between the first contact surface and the second contact surface by means of the movement of the wire guiding tool, and the second contact surface.

Subsequently, the further contact area is wetted using an at least partially fused second solder material amount formed from a solder material molded piece for establishing a further solder material connection in such a manner that a mechanical electrically conductive connection is established between the wire section end and the further contact surface.

Subsequently, the wire section can be separated from the wire guided by means of the wire guiding tool. The separation can be performed mechanically or even thermally by applying laser to the intended separation location.

The differentiation according to the disclosure between positioning the wire relative to the contact surfaces resulting in forming a contact area by means of a wire guiding tool and establishing the electrically conductive and mechanical contact between the wire and the contact surface by means of wetting the contact area with solder material independently of the wire guiding tool results in the contact surface, which is to be connected to the wire, not being mechanically stressed. Due to the wire connection established between the contact surface and the wire by means of wetting, in particular multi-cored wires or even pressure-sensitive wires or conductors, such as in particular electrically conductive insulated optical fibers, can also be connected to the contact surface.

Apart from the fact that an exertion of force on the contact is thus avoided and thus particularly pressure-sensitive contacts can be electrically connected to a wire, an essentially flat surface of the contact, as would be essential for performing ultrasonic bonding, is not required, either. Thus, a wire can also be contacted to a curved or even spherical contact surface, for example.

In particular row or series contacting can be performed in which a plurality of contact surfaces is connected to a continuously formed wire conductor.

It is particularly advantageous if the first contact area and the second contact area are wetted by a solder material molded piece being arranged at a distance from the contact area in an initial position, by the solder material molded piece being at least partially fused in the initial position, and by the at least partially fused solder material molded piece being thrown against the contact area from the initial position. Owing to this, even those contact areas formed between a contact surface and the wire can be wetted with the solder material which would not be accessible using a mechanical transfer device for applying solder material in the contact area. In fact, it is possible to perform the wetting procedure from an initial position spaced apart from the contact area.

It is particularly advantageous if the solder material molded piece is arranged in a mouthpiece of a capillary above a dispenser opening of the mouthpiece for defining the initial position, the diameter of the dispenser opening being smaller than the diameter of the solder material molded piece, the solder material molded piece being fused by applying laser energy to the solder material molded piece and the fused solder material molded piece being dispensed by applying gas pressure to the solder material molded piece.

A laser device used for applying laser to the molded piece can preferably also be used as a separating device or also for removing an insulation from the wire prior to wetting the wire arranged on the contact surface so that insulated wires can also be used for performing the method.

The device according to the disclosure comprises the features of claim 5.

The device according to the disclosure comprises a wire guiding tool for positioning a contact end of a wire relative to a first contact surface and for forming a wire section between the first contact surface and at least one further contact surface as well as for positioning a wire section end relative to the further contact surface and a solder material application device for applying an at least partially fused solder material molded piece in a contact area formed between the contact end and the first contact surface and a contact area formed between the wire section end and the further contact surface.

Preferably, the device comprises a separating device for separating the wire section.

Preferably, the solder material application device is realized independent of the wire guiding tool so that the application device can be positioned independently of the wire guiding device, i.e. the application of the solder material molded pieces can be carried out in consecutive contact positions of the wire guiding tool from different initial positions which enable the respectively best wettability of the contact area.

If the wire guiding tool comprises a wire guiding capillary for dispensing a wire conveyed out of a dispenser opening formed in a mouthpiece of the wire guiding capillary by means of a feeder device, an exact positioning of a contact end, which protrudes from the dispenser opening, relative to the contact surface to be contacted is ensured.

Preferably, the separating device is realized at least partially via the mouthpiece of the wire guiding capillary so that the mouthpiece can implement several functions.

Preferably, the separating device has a separating element which is realized so as to be moveable with respect to the mouthpiece of the wire guiding capillary so that, when realizing the separating element as a first knife edge of the separating device, the mouthpiece of the wire guiding capillary can form an opposite knife edge.

Preferably, the wire guiding capillary is rigidly connected to a wire hold-down device via a base body of the wire guiding tool, said wire hold-down device being spaced apart from the mouthpiece of the wire guiding capillary via an intermediate space comprising a separating element. Owing to this, a particularly compact design of the wire guiding tool having several functions is possible.

The component arrangement according to the disclosure comprises a plurality of electronic components realized in particular as chips, said electronic components being arranged in a stack arrangement, contact surfaces arranged on connection sides of the components being connected to each other using a wire connection established according to any one of the claims 1 to 4 in such a manner that a wire section is formed between a first solder material connection, which connects a first contact surface of the first component to a contact end of a wire, and a second solder material connection, which connects a second contact surface of a further component to the wire.

In a first advantageous embodiment, the components form a pyramid-shaped stack arrangement in such a manner that a component connection is established between a connection side and a rear side of two components arranged on top of each other and that wire sections, which are formed for connecting contact surfaces of the components, extend over adjacent lateral edges of the components in cascades.

In a further advantageous embodiment of the component arrangement, a component connection is established between opposing rear sides of two components arranged on top of each other, and wire sections formed for connecting contact surfaces of the components extend over adjacent lateral edges of the components in arches.

In the following, a preferred variation of the method according to the disclosure as well as a preferred embodiment of the device used with this method and advantageous component arrangements are described in more detail.

In the following,

FIG. 1 illustrates establishing a wire connection between a wire and a contact pin of a contact plug comprising a plurality of contact pins by means of a first embodiment of a wire connection device;

FIG. 2 illustrates establishing a connection between a wire and a contact surface of a contact circuit board received in the contact plug;

Figure 3:
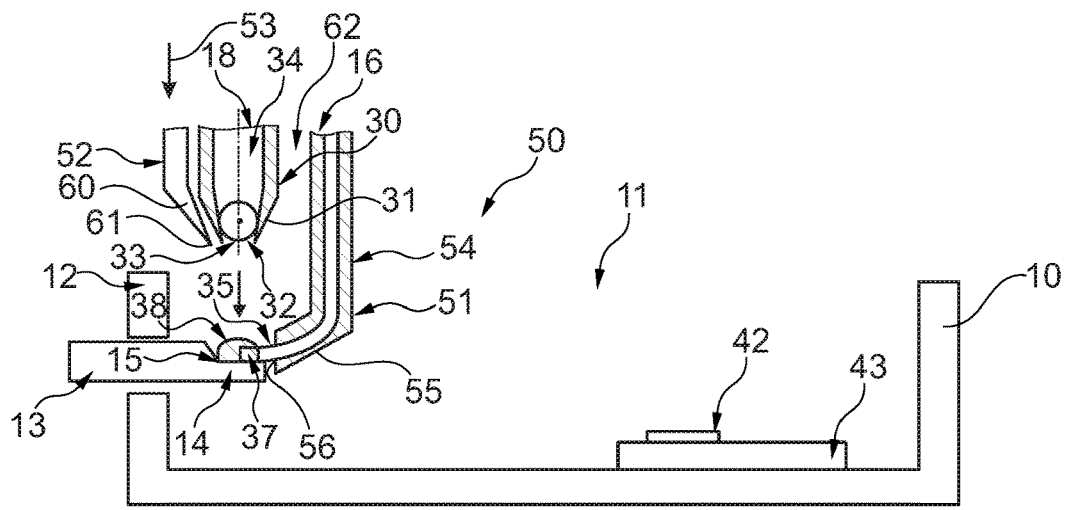
FIGS. 3 to 5 illustrate establishing a wire connection by means of a second embodiment of a wire connection device.

FIG. 1 illustrates a cup-shaped housing part 10 of a contact plug 11 in a schematic view, a plurality of contact pins 13 being provided in the housing part 10 on a front side 12, i.e. the side which faces towards a contact bushing (not illustrated), which is provided for being combined with the contact plug 11, only one contact pin 13 being illustrated in this instance for simplifying the illustration.

At its rear connecting part 14 arranged within the housing part 10, the contact pin 13 has a contact surface 15 realized here by a flat portion. A wire connection device 16 is arranged above or to the right of the contact surface 15, said wire connection device 16 comprising a wire guiding tool 17 as well as a solder material application device 18.

The wire guiding tool 17 comprises a wire guiding capillary 19 as well as a hold-down device 21 connected to the wire guiding capillary 19 via a base body 20. A separating element 23, which is realized as a knife edge having a cutting edge 24, is received in an intermediate space 22 formed between the hold-down device 21 and the wire guiding capillary 19.

The wire guiding capillary 19 comprises a mouthpiece 25 which is provided with an opposite knife edge 27 adjacent to a dispenser opening 26, said opposite knife edge 27 forming a separating device 28 in conjunction with the separating element 23 having the cutting edge 24.

In order to carry out a multiaxial movement of the wire guiding tool 17, the base body 20 is provided with a coupling device 29 which enables connecting the wire guiding tool 17 to a hand axis of a robot device (not illustrated).

The solder material application device 18 comprises an application capillary 30 having a mouthpiece 31 which is provided with a dispenser opening 32. For an application of laser to a solder material molded piece 33 received in the mouthpiece 31 above the dispenser opening 32, the solder material application device 18 is provided with a laser device (not illustrated) emitting laser radiation along a channel axis 34 of the application capillary 30. Just like the wire guiding tool 17, the solder material application device 18 can also be connected to a hand axis of a robot device so as to carry out a multiaxial movement.

Both the wire guiding tool 17 as well as the solder material application device 18 are provided with a supply device (not illustrated) which, in the case of the wire guiding tool 17, comprises a feeder device (not illustrated), a wire 35 guided longitudinally in the wire guiding capillary 19 being moved forward towards a channel axis 36 by means of said feeder device and being unwound from a wire storage spool (also not illustrated).

In the case of the solder material application device 18, the supply device is provided with a storage reservoir for receiving solder material molded pieces 33 which are removed individually from the solder material reservoir by means of the supply device and are conveyed into the initial position P illustrated in FIG. 1 for applying the solder material molded piece 33.

The configuration illustrated in FIG. 1 illustrates the wire connection device 16 directly after forming a solder material connection 38 established between a contact end 37 of the wire 35 and the contact surface 15 of the contact pin 13.

In order to establish the solder material connection 38 illustrated in FIG. 1, the contact end 37 guided out of the wire guiding capillary 19 is positioned on the contact surface 15 so as to form a contact area 39. For this purpose, the wire 35 is guided through a receiving groove 40 of the hold-down device 21, said receiving groove 40 being open towards the to bottom in this instance. If the contact end 37 is in the contact position illustrated in FIG. 1, the solder material molded piece 33 received in the mouthpiece 31 of the application capillary 30 is at least partially fused in such a manner that the solder material molded piece 33, whose diameter d is larger than the diameter D of the dispenser opening 32 prior to the at least partial fusing, is dispensed out of the dispenser opening 32 by applying gas pressure to the solder material molded piece 33 and is thrown against the contact area 39. Owing to the at least partially fused solder material molded piece 33 landing on the contact area 39, the latter is wetted as illustrated in FIG. 1.

After establishing the solder material connection 38 illustrated in FIG. 1, the wire guiding tool 17 or the base body 20 of the wire guiding tool 17 is moved to the second contact position illustrated in FIG. 2; owing to the mechanical fixation of the contact end 37 of the wire 35 to the contact pin 13, a wire section 41 is formed between the contact pin 13 and the mouthpiece 25 of the wire guiding capillary 19 of the wire guiding tool 17 such that a further contact area 44 is formed between a contact surface 42 of a circuit board 43 received in the housing part 10 and a wire section end 45, a wire 35 resting with the wire section end 45 on the contact surface 42 in the contact area 44.

In order to assist the connection area 45 in resting on or abutting against the contact surface 42 upon forming the contact area 44, the base body 20 is pivoted about a pitch axis 46 in the present instance in such a manner that the hold-down device 21 now causes a slight angulation in the progression of the wire section 35.

In the contact position of the wire guiding tool 17 illustrated in FIG. 2, the solder material application device 18 becomes active again in the manner described above such that, for establishing a solder material connection 48, a further solder material molded piece 33 is thrown against the contact area 44 in order to wet the contact area 44.

Subsequently, the wire section 41 is separated via an axial cutting motion 49 of the knife edge 23, resulting in the wire 35 being cut.

Figure 4:
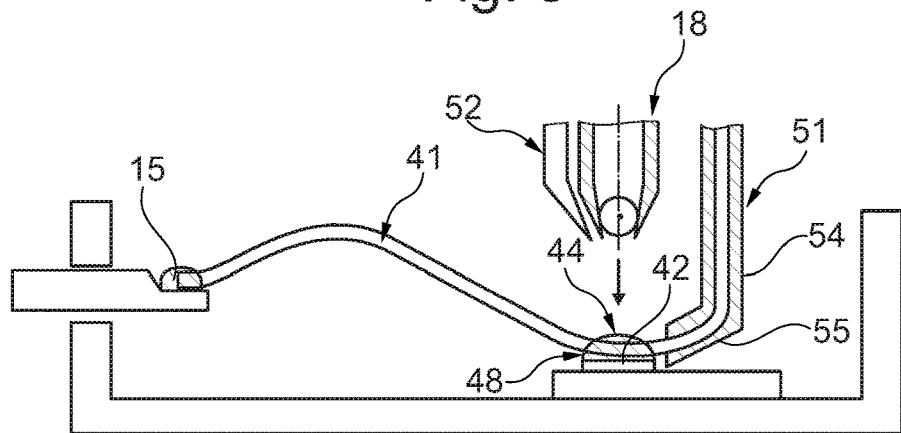
Figure 5:
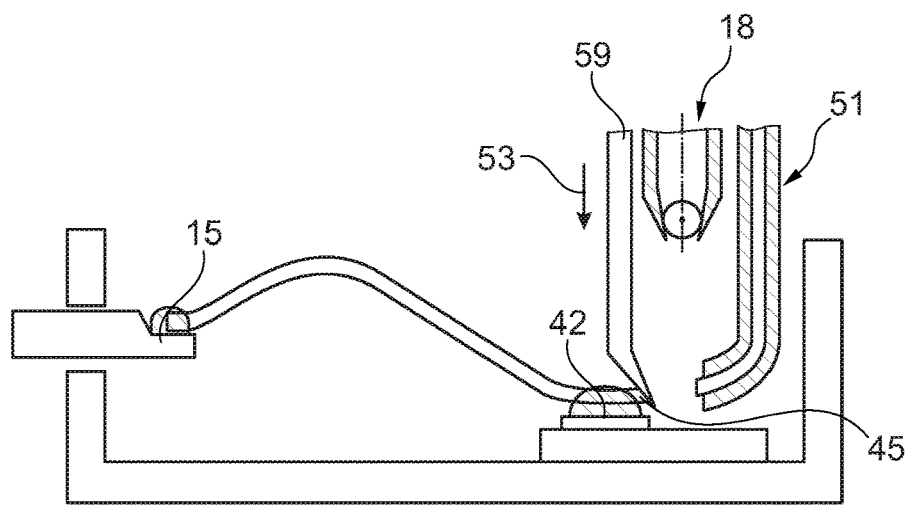

In FIGS. 3 to 5, another embodiment of a wire connection device 50 is illustrated which, in contrast to the wire connection device 16 illustrated in FIGS. 1 and 2, comprises an arrangement of a wire guiding tool 51 and a separating device 52 in such a manner that a solder material application device 18, which is identical to the solder material application device 18 in this instance and consequently has the same reference numeral, is arranged in an intermediate space 62 formed between the wire guiding tool 51 and the separating device 52.

In particular the wire guiding tool 51, the solder material application device 18 and the separating device 52 of the wire connection device illustrated in FIGS. 3 to 5 can be multiaxial if necessary and can be formed so as to be movable independently of each other in the space in order to be able to connect contact surfaces oriented differently in the space to each other.

The wire guiding tool 51 comprises a wire guiding capillary 54 which is oriented vertically in this instance and at its free end is provided with an angled mouthpiece 55 having a dispenser opening 56. As can be seen in FIG. 3, the wire guiding capillary 54 enables orienting a contact end 37 of the wire 35 towards the contact surface 15 when being arranged essentially vertically such that the contact end 37 is arranged so as to overlap with the contact surface 15 and simultaneously cuts an application axis defined by the channel axis 34 of the solder material application device 18. In this configuration, an at least partially fused solder material molded piece 33 can be applied on the contact surface 15, as already described in reference to FIG. 1.

After the first solder material connection 38 has been established between the contact end 37 and the contact surface 15, the wire guiding tool 51 is moved to the second contact position illustrated in FIG. 4 for forming the wire section 41, as has already been described in reference to FIGS. 1 and 2, in such a manner that a further contact area 44 is formed between the further contact surface 42 and the wire section end 45, the wire resting with the wire section end 45 on the contact surface 42 in the contact area 44.

In order to establish a further solder material connection 48, a further at least partially fused solder material molded piece 33 is applied against the contact area 44 in the contact position of the wire guiding tool 51 illustrated in FIG. 4 such that the contact area 44 and the wire 35 are wetted. In the event that the further solder material connection 48 should be the last of several solder material connections established between the wire 35, which is continuously guided out of the mouthpiece 55 of the wire guiding tool 51, and contact surfaces, the wire section is subsequently separated by a cutting motion 53 of the separating device 52 in such a manner that a cutting edge 61 formed on a separating element 60 of the separating device 59 cuts the wire 35 as illustrated in FIG. 5.

Figure 6:
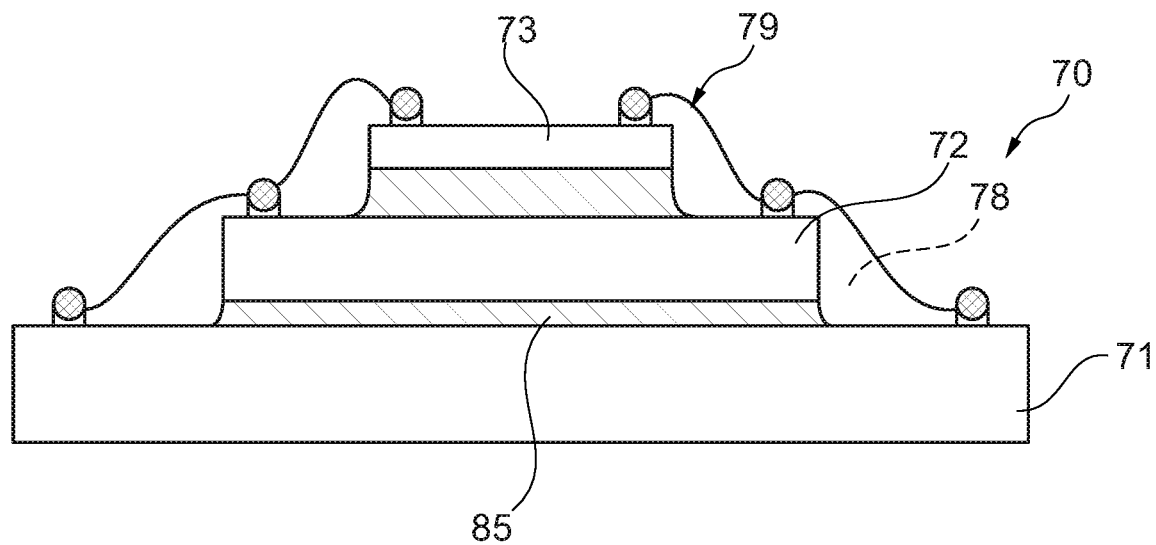
FIG. 6 illustrates a component arrangement in a first embodiment.

FIG. 6 illustrates a component arrangement 70 having three components 71, 72, 73 arranged one on top of the other in a pyramid-shaped stack arrangement and realized as chips in this instance. For fixing the components 71, 72, 73 on top of each other, a component connection 85 established by an underfiller in this instance is provided in adjacent components between a connection side 83 provided with contact surfaces 75, 76, 77 and a rear side 84.

The component arrangement 70 comprises wire connections established preferably by using a wire connection device 50 illustrated in FIGS. 3 to 5, the contact surfaces 75, 76, 77, which are each provided on a lateral edge of the connection side 83, being connected to each other via wire sections 78 in such a manner that a solder material connection 80, 81 and 82 is established between a wire 79 forming the wire section 78 and the contact surfaces 75, 76, 77 in each instance.

Figure 7:
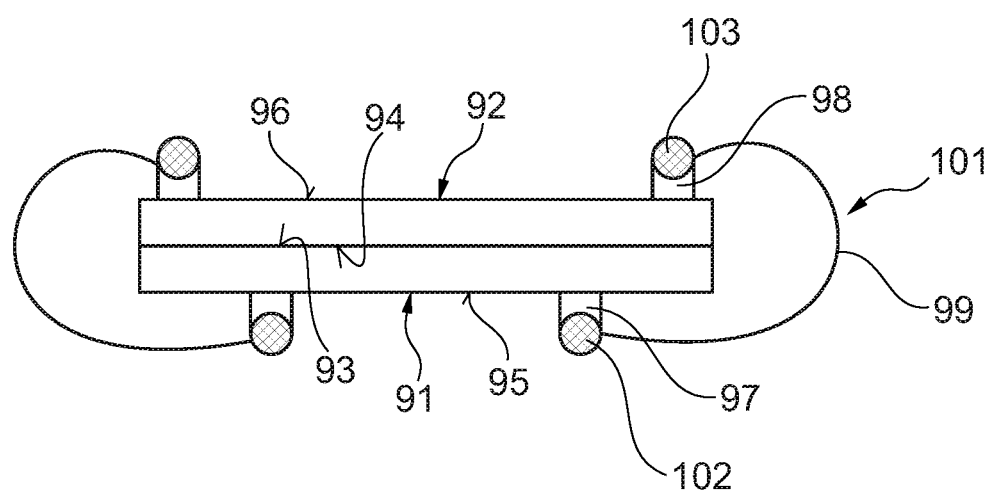
FIG. 7 illustrates a component arrangement in a further embodiment.

FIG. 7 illustrates a component arrangement 90, which is also preferably produced using the wire connection device 50 and which comprises two components 91, 92 also realized as chips and connected to each other via their rear sides 93, 94 in such a manner that connection sides 95, 96 of the components 91, 92, which are each provided with two contact surfaces 97, 98 in the present instance, each form an exterior of the component arrangement 90. In order to connect two contact surfaces 97, 98 to each other, which are allocated to each other and are arranged on the connection sides 95, 96 facing away from each other, the contact surfaces 97, 98 are connected to each other via wire sections 99 in such a manner that a wire 101 forming the wire section 99 establishes a wire connection between the components 91, 92 via a first solder material connection 102 formed on the lower connection side 95 with the contact surface 97 and via a second solder material connection 103 formed with the contact surface 98 arranged on the upper contact side 94.

The invention claimed is:

1. A method for establishing a wire connection between a first contact surface and at least one further contact surface, in which a contact end of a wire is positioned in a contact position relative to the first contact surface by means of a wire guiding tool and a contact area, which is formed between the first contact surface and the contact end, is subsequently wetted using an at least partially fused first solder material amount formed from a solder material molded piece in order to establish a first solder material connection in such manner that a mechanical, electrically conductive connection is formed between the first contact surface and the contact end, the wire guiding tool is subsequently moved to the further contact surface in such a manner that a contact area is formed between a wire section end of a wire section, which is formed between the first contact surface and the further contact surface by means of the movement of the wire guiding tool, and the further contact surface, and the second contact area is subsequently wetted using an at least partially fused second solder material amount formed from a solder material molded piece in order to establish at least one further solder material connection in such a manner that a mechanical electrically conductive connection is established between the wire section end and the further contact surface.

2. The method according to claim 1, wherein after establishing the further solder material connection, the wire section is separated from the wire which is guided by means of the wire guiding tool.

3. The method according to claim 1, wherein the first contact area and the second contact area are wetted by a solder material molded piece being arranged in an initial position at a distance from the contact area, said solder material molded piece being at least partially fused in the initial position and said at least partially fused solder material molded piece being thrown against the contact area from the initial position.

4. The method according to claim 3, wherein for defining the initial position, the solder material molded piece is arranged in a mouthpiece of an application capillary above a dispenser opening of the mouthpiece, the diameter D of the dispenser opening being smaller than the diameter d of the solder material molded piece, said solder material molded piece being fused by laser energy being applied to the solder material molded piece and the fused solder material molded piece being dispensed by means of gas pressure being applied to the solder material molded piece.

5. A device for establishing a wire connection between a first contact surface and at least one further contact surface, comprising a wire guiding tool for positioning a contact end of a wire relative to the first contact surface and for forming a wire section between the first contact surface and the further contact surface as well as for positioning a wire section end relative to the further contact surface and a solder material application device for applying an at least partially fused solder material molded piece in a contact area formed between the contact end and the first contact surface and a contact area formed between the wire section end and the further contact surface and a separating device for separating the wire section wherein the wire guiding tool comprises a wire guiding capillary for dispensing a wire conveyed by means of a feeder device out of a dispenser opening formed on a mouthpiece of the wire guiding capillary, and the separating device has a separating element which is realized moveable relative to the mouthpiece of the wire guiding.

6. The device according to claim 5, wherein the solder material application device is formed independent of the wire guiding device.

7. The device according to claim 5, wherein the separating device is at least partially formed by the mouthpiece of the wire guiding capillary.

8. The device according to claim 5, wherein the wire guiding capillary is rigidly connected to a wire hold-down device via a base body of the wire guiding tool, said wire hold-down device being spaced apart from the mouthpiece of the wire guiding capillary via an intermediate space comprising the separating element.

9. A component arrangement having a plurality of, chips said, chips being arranged in a stack arrangement, and contact surfaces arranged on connection sides of the chips being connected to each other using a wire connection established according to claim 1 in such a manner that a wire section is formed between a first solder material connection, which connects a first contact surface of the first chip to a contact end of a wire, and a second solder material connection, which connects a second contact surface of another chip to the wire.

10. The component arrangement according to claim 9, wherein the chips form a pyramid-shaped stack arrangement such that a chip connection is established between a connection side and a rear side of two chips arranged on top of each other and that wire sections formed for connecting contact surfaces of the chips extend over adjacent lateral edges of the chips in cascades.

11. The component arrangement according to claim 9, wherein a chip connection is established between opposing rear sides of two chips arranged on top of each other and wire sections formed for connecting contact surfaces of the chips extend over adjacent lateral edges of the chips in arches.

* * * * *